United States Patent
Nagahata et al.

(10) Patent No.: US 6,392,685 B1
(45) Date of Patent: May 21, 2002

(54) DRIVE IC CHIP AND PRINTHEAD

(75) Inventors: Takaya Nagahata; Koji Nishi; Yasuhiro Yoshikawa, all of Kyoto (JP)

(73) Assignee: Rohm Co. Ltd., Kyoto (JP)

( * ) Notice: Subject to any disclaimer, the term of this patent is extended or adjusted under 35 U.S.C. 154(b) by 0 days.

(21) Appl. No.: 09/622,649

(22) PCT Filed: Dec. 21, 1999

(86) PCT No.: PCT/JP99/07167

§ 371 Date: Aug. 21, 2000

§ 102(e) Date: Aug. 21, 2000

(87) PCT Pub. No.: WO00/37255

PCT Pub. Date: Jun. 29, 2000

(30) Foreign Application Priority Data

Dec. 22, 1998 (JP) ............................................. 10-364396

(51) Int. Cl.⁷ ................................................ B41J 2/435
(52) U.S. Cl. ...................................... 347/237; 347/247
(58) Field of Search ................................ 347/206, 208, 347/209, 211, 237, 247; 257/355, 360, 660, 668

(56) References Cited

U.S. PATENT DOCUMENTS

| | | | |
|---|---|---|---|
| 5,335,002 A | 8/1994 | Nagahata et al. | 347/209 |
| 5,532,723 A | 7/1996 | Nagahata et al. | 347/209 |
| 5,585,666 A | * 12/1996 | Imamura | 257/668 |
| 5,657,067 A | * 8/1997 | Nagahata | 347/209 |
| 5,917,220 A | * 6/1999 | Waggoner | 257/360 |

FOREIGN PATENT DOCUMENTS

| | | | |
|---|---|---|---|
| JP | 60-52365 | 3/1985 | B41J/3/20 |
| JP | 5-63022 | 3/1993 | H01L/21/60 |
| JP | 5-301366 | 11/1993 | B41J/2/345 |

* cited by examiner

*Primary Examiner*—Hai Pham
(74) *Attorney, Agent, or Firm*—Michael D. Bednarek; Shaw Pittman LLP

(57) ABSTRACT

A drive IC chip (A) has a primary surface (10) which includes a corner (11a) at which a first and a second pads (3a, 3b) are provided so that their respective centers (Oa, Ob) are deviate positionally from each other in both directions x, y. With this structure, even if two wires for electric connection are extended from the first and the second pads (3a, 3b) either in the x direction or in the y direction, it is possible to advantageously prevent the wires from becoming too close to each other into shorting contact.

7 Claims, 8 Drawing Sheets

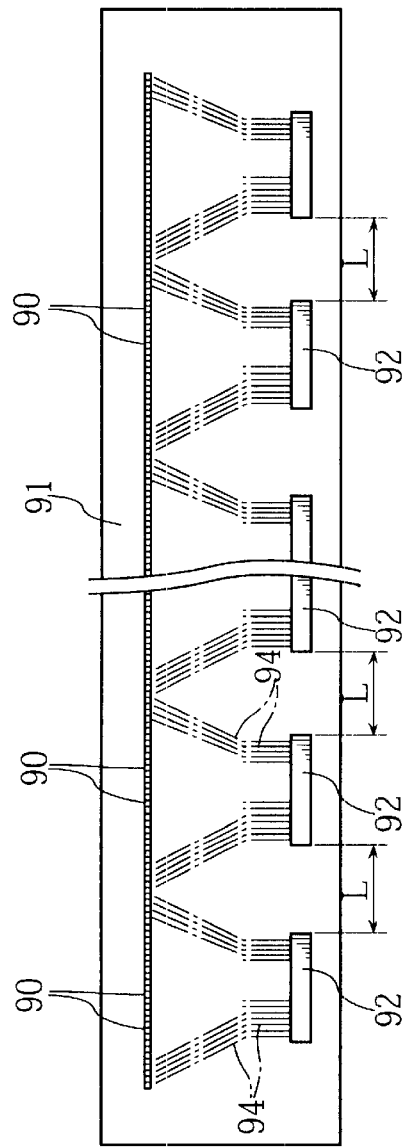
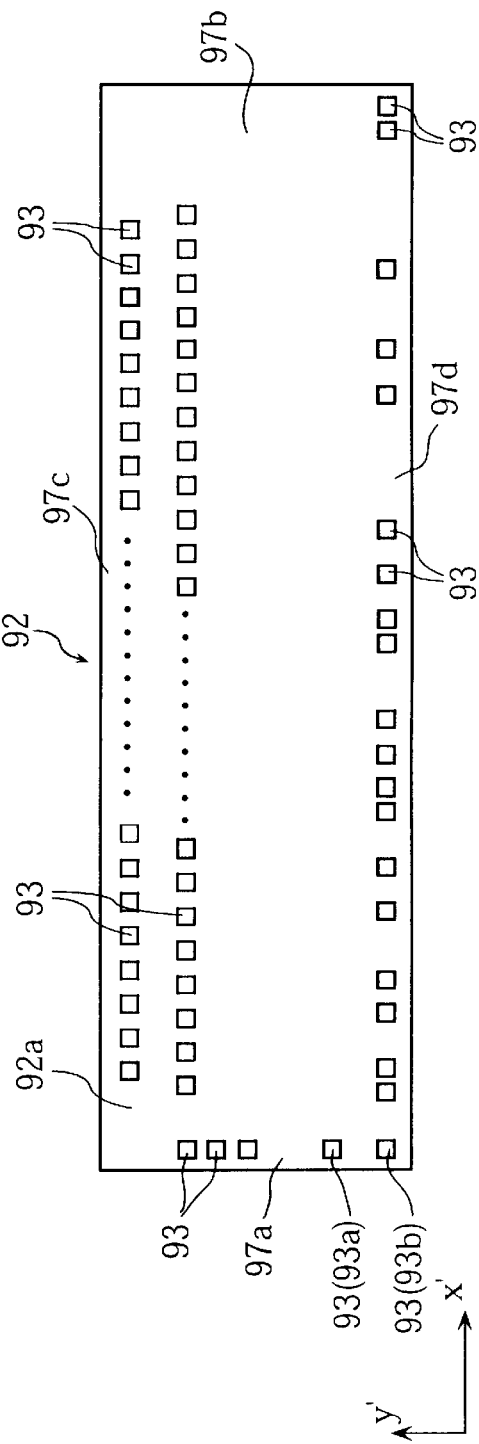

DRIVE IC CHIP AND PRINTHEAD

TECHNICAL FIELD

The present invention relates to a drive IC chip for driving a plurality of printing elements provided on a printhead. It also relates to such a printhead.

BACKGROUND ART

FIG. 8 schematically shows an example of structure of a thermal printhead. The thermal printhead includes a substrate 91 on which a plurality of heating elements 90 and a plurality of drive IC chips 92 are provided in a respective array. Each of the drive IC chips 92 has a built-in integrated circuit (not shown) for selectively driving the plurality of heating elements 90. When printing data are transmitted from the outside to the integrated circuit, the plurality of heating elements 90 are selectively heated in accordance with the data. Such heating causes printing of an image on a recording paper such as a thermosensitive paper.

FIG. 9 illustrates the structure of the prior art drive IC chip 92. The drive IC chip 92 has a rectangular primary surface 92a which is provided with a plurality of wire-bonding pads 92. The plurality of pads 93 are utilized for electrically connecting the built-in integrated circuit of the drive IC chip 92 to the plurality of heating elements 90, or for supplying power or various signals necessary to drive the integrated circuit. The plurality of pads 93 are arranged along edges 97a, 97b extending widthwise of the primary surface 92a and/or edges 97c, 97d extending lengthwise of the primary surface 92a. In FIG. 9 and any subsequent figures, the direction of a arrow x' is defined as the lengthwise direction, whereas the direction of an arrow y' is defined as the widthwise direction.

A single drive IC chip 92 controls, for example, 64 heating elements 90. Assuming that the thermal printhead shown in FIG. 8 provides a printing density of 200 dpi (8 dots/mm) and a maximum printing width of A4 size, the total number of the heating elements 90 is 1728. In this case, the thermal printhead carries a total of 27 drive IC chips 92 suitably arranged at an appropriate interval L.

The prior art described above has the following problems.

In use, two pads 93a, 93b, for example, of each drive IC chip 92 are wire-bonded to pads 96a, 96b, respectively, on the substrate 91, as shown in FIG. 10. The pads 96a, 96b are preferably arranged between two adjacent drive IC chips 92 for allowing two wires W from the respective pads 93a, 93b to extend in the lengthwise direction. If the two wires W from the pads 93a, 93b extend in the widthwise direction as shown in FIG. 11, the wires W become too close to each other because the two pads 93a, 93b overlap each other in the lengthwise direction. This is not preferable for avoiding shorting.

In practically manufacturing a thermal printhead, however, it may be sometimes impossible to extend the wires W in the lengthwise direction. For instance, a larger number of heating elements 90 and drive IC chips 92 need to be used to increase the printing density of a thermal printhead beyond 200 dpi. Accordingly, as shown in FIG. 11, the distance L1 between adjacent drive IC chips 92 becomes smaller than the distance L, so that it may be difficult to dispose the pads 96a, 96b at a narrow region between the drive IC chips 92. Even if the pads 96a, 96b can be disposed between the drive IC chips 92, difficulty may arise in wire-bonding to the pads. In such a case, the wires W need to be extended from the pads 93a, 93b in the widthwise direction as shown in FIG. 11, which is not preferable to prevent shorting between the wires W.

In this way, according to the prior art described above, only one direction is preferred for extending a wire from a pad. A drive IC chip, which is suitable for use in a thermal printhead having a smaller printing density, is not suitable for use in a thermal printhead having a larger printing density because the wire-extending direction needs to be changed. Such a limitation on the wire-extending direction leads to a limitation on the freedom of design with respect to the wiring pattern on the substrate which carries the drive IC chip.

DISCLOSURE OF THE INVENTION

It is, therefore, an object of the present invention to provide a drive IC chip and a printhead which eliminate or lessen the problems described above.

In accordance with a first aspect of the present invention, there is provided a drive IC chip comprising: a built-in integrated circuit for selectively driving a plurality of printing elements of a printhead; a primary surface including at least one first edge extending in a first direction, and at least one second edge extending in a second direction transverse to the first direction; a first and a second pads provided on the primary surface in electrical connection to the integrated circuit; wherein the first and the second pads are provided at a corner at which the first and the second edges meet; and wherein respective centers of the first and the second pads deviate positionally from each other in the first and the second directions.

With the drive IC chip having such a structure, wires may be bonded to the first and the second pads at respective portions which deviates positionally from each other in the first and the second directions. Accordingly, regardless of whether the wires are extended in the first direction or in the second direction, the wires can be appropriately spaced from each other to reduce the likelihood of shorting between the wires. Further, since the first and the second pads are provided at a common corner of the primary surface, the wires can be readily extended out of the drive IC chip, regardless of whether the wires are extended in the first direction or in the second direction.

According to the present invention, in this way, there is no great limitation on the extending direction of the wires which are connected to the first and the second pads. Thus, the present invention is applicable both where wires can be extended toward a region between adjacent drive IC chips, and where such wire-extension is impossible. Further, since the wire extending direction is selectable, there will be greater freedom in designing the wiring patterns for the substrate on which the drive IC chips are mounted.

Preferably, each of the first and the second pads may be used either for supplying power for driving the integrated circuit, or for grounding the integrated circuit, or for inputting/outputting signals to the integrated circuit.

Preferably, the first and the second pads may be held entirely out of overlapping relation with each other both in the first and the second directions. Such an arrangement make it is possible to more reliably prevent the wires connected to the first and the second wires, respectively, from becoming too close to or contacting each other.

Preferably, the first pad may be rectangular to be elongate in the first direction, whereas the second pad may be rectangular to be elongate in the second direction. With such a structure, it is possible to bond wires to the first and the second pads at respective positions which are offset from respective centers of the pads longitudinally thereof. As a result, the distance between the wires can be increased, which is advantageous in preventing the wires from contacting.

Preferably, the first pad may be provided at the first edge, whereas the second pad may be provided at the second edge. With such a structure, it is possible to arrange the first and the second pads at the corner of the primary surface in a space-efficient manner, thereby decreasing waste of space at the corner.

Preferably, the primary surface may be rectangular to have a pair of first edges, a pair of second edges, and four corners.

Preferably, the drive IC chip may further include a plurality of third pads for electrically connecting the integrated circuit to the plurality of printing elements, and the third pads be arranged along one of the paired second edges.

Preferably, the first and the second pads are provided at one of the four corners which is close to the other of the paired second edges. Such an arrangement enables the first and the second pads to be kept away from the plurality of third pads as much as possible in a space-efficient manner.

In accordance with a second aspect of the present invention, there is provided a printhead comprising a substrate provided with a plurality of printing elements arranged in a row, and a plurality of drive IC chips; each of the drive IC chips comprising: a built-in integrated circuit for selectively driving the plurality of printing elements; a primary surface including at least one first edge extending in a first direction, and at least one second edge extending in a second direction transverse to the first direction; a first and a second pads provided on the primary surface in electrical connection to the integrated circuit; wherein the first and the second pads are provided at a corner at which the first and the second edges meet; and wherein respective centers of the first and the second pads deviate positionally each other in the first and the second directions.

Preferably, the printing elements are heating elements.

The printhead having such a structure enjoys the same advantages as the drive IC chip provided in accordance the first aspect of the present invention.

Other features and advantages of the present invention will become clearer from the description of embodiments given below.

BRIEF DESCRIPTION OF THE DRAWINGS

FIG. 8 is a plan view of a prior-art printhead.

FIG. 9 is a plan view of a prior-art drive IC chip.

BEST MODE FOR CARRYING OUT THE INVENTION

Preferred embodiments of the present invention will be described below with reference to the accompanying drawings.

Figure 1:
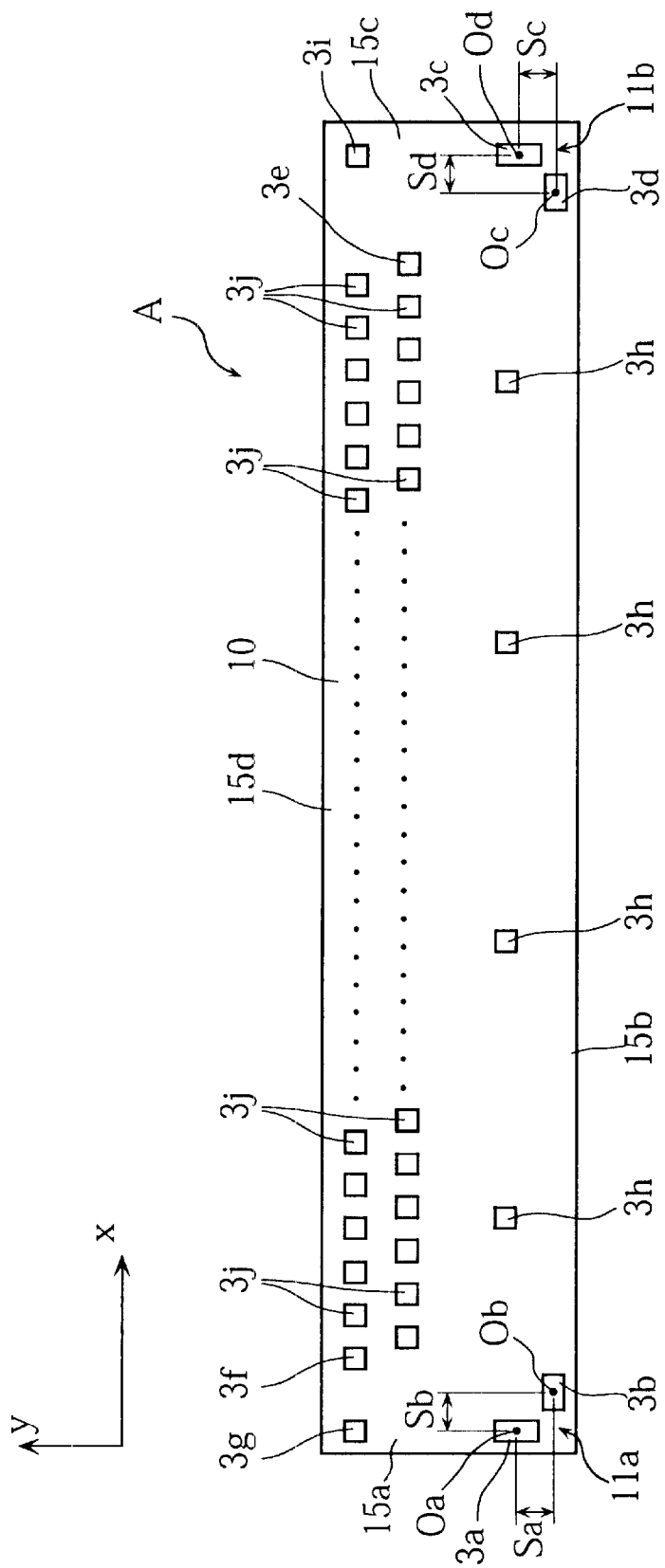
FIG. 1 is a plan view showing an example of drive IC chip embodying the present invention.

FIG. 1 illustrates an example of drive IC chip embodying the present invention. In any embodiments of the present invention, the direction of an arrow x is defined as a lengthwise direction, whereas the direction of an arrow y is defined as a widthwise direction.

A drive IC chip A in the this example has a rectangular parallelepiped shape having a rectangular primary surface 10 which is elongated in the lengthwise direction. The primary surface 10 includes an opposite pair of end edges 15a, 15c extending in the widthwise direction, and an opposite pair of longitudinal edges 15b, 15d extending in the lengthwise direction. Various kinds of pads 3a~3j are provided, each kind in a predetermined number, on the primary surface 10. Each of the pads 3a~3j has a size and a shape suitable for wire-bonding.

The pad 3a and the pad 3b are examples of a first and a second pads, respectively, of the present invention. The pads 3a, 3b are disposed on the primary surface 10 at a corner 11a where the two edges 15a, 15b intersect with each other. In the present invention, the term "edge of the primary surface" is a region having a certain width. Therefore, a "corner" in the present invention is also a region which has a certain area and which includes part of the edges of the primary surface. The pad 3a is used for supplying electric power necessary for driving an integrated circuit 12 which is built in the drive IC chip A and which will be described later. This pad is rectangular to be elongate in the widthwise direction and is disposed at the edge 15a. The pad 3b is used for grounding the integrated circuit 12. This pad is rectangular to be elongate in the lengthwise direction and is disposed at the edge 15b. The pads 3a, 3b are so arranged that their respective centers Oa, Ob deviate from each other both in the widthwise and lengthwise directions by suitable amounts Sa, Sb, respectively. Further, the pads 3a, 3b are held entirely out of overlapping relation with each other both in the widthwise and lengthwise directions.

The pad 3c and the pad 3d are other examples of a first and a second pads, respectively, of the present invention. The pad 3c is used for inputting strobe signals to the integrated circuit 12. Similarly to the pad 3b, the pad 3d is used for grounding the integrated circuit 12. The shape and arrangement of the pads 3c, 3d are substantially identical to the pads 3a, 3b, except that the pads 3c, 3d are disposed on the primary surface 10 at another corner 11b where the two edges 15b, 15c intersect with each other. The pad 3c is rectangular to be elongate in the widthwise direction and is disposed at the edge 15c. The pad 3d is rectangular to be elongate in the lengthwise direction and is disposed at the edge 15b. The pads 3c, 3d are so arranged that their respective centers Oc and Od deviate from each other both in the widthwise and lengthwise directions by suitable amounts Sc, Sd, respectively. Further, these pads are entirely out of overlapping relation with each other both in the widthwise and lengthwise directions.

The plural pads 3*j* are examples of third pads of the present invention. The pads are used for connection to plural heating elements 5 of a thermal printhead B or Ba which will be described later. The pads 3*j* are disposed at or near the edge 15*d* in staggered relationship in two rows extending in the lengthwise direction. The pad 3*f* is used for receiving image printing data from the outside. The pad 3*g* is used for receiving clock signals from the outside. The plural pads 3*h* are used for grounding heating elements. The pad 3*i* is used for outputting image printing data to another drive IC chip (not shown) disposed next to the drive IC chip A. The pad 3*e* is used for receiving latch signals from the outside. The pads 3*f*~3*i* are arranged at positions which do not hinder wire-bonding of the pads 3*a*~3*d*.

Figure 2:
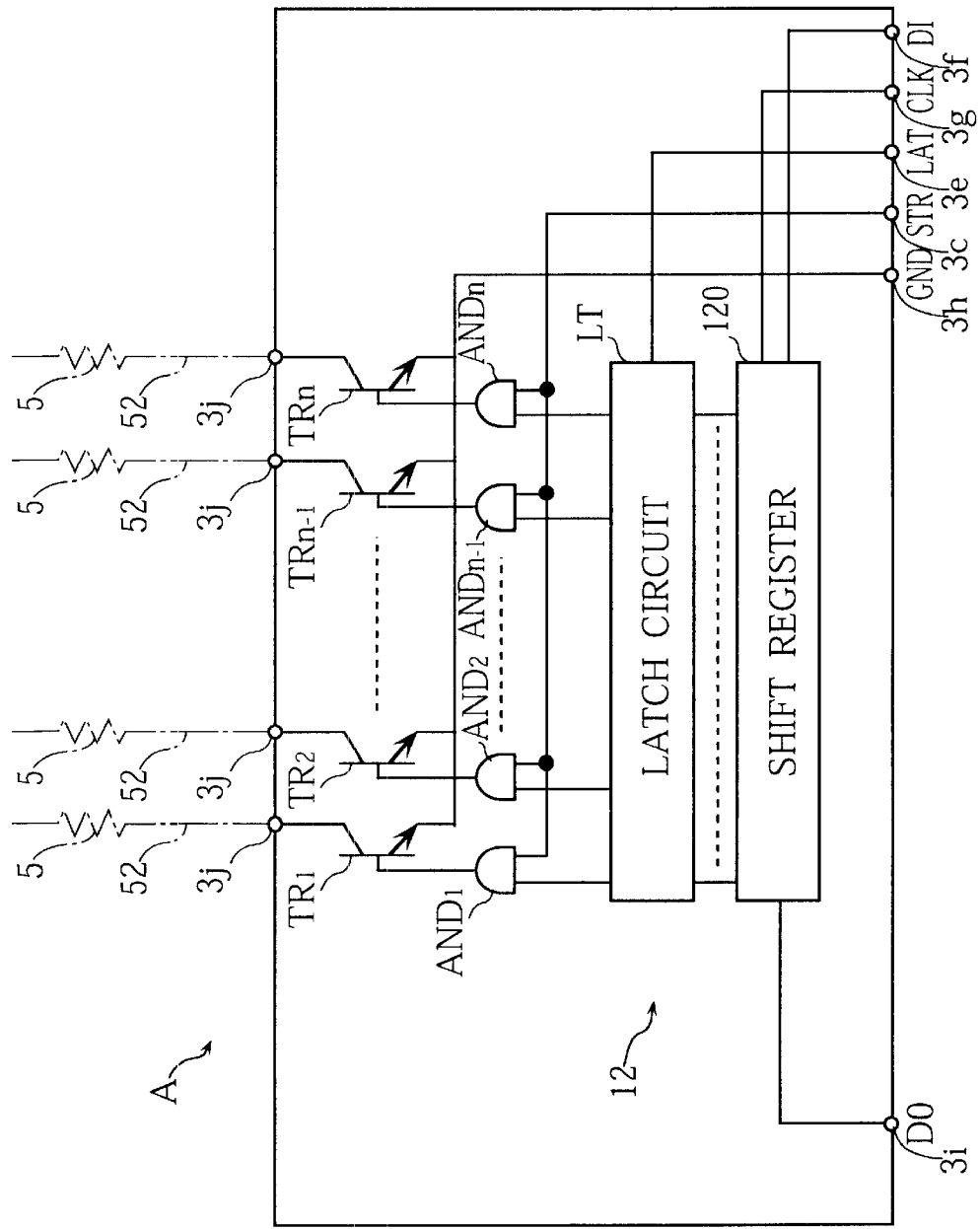
FIG. 2 is a block circuit diagram showing an example of integrated circuit.

As better shown in FIG. 2, the integrated circuit 12 includes a shift register 120, a latch circuit LT, a plurality of (an n number of) AND circuits $AND_1$~$AND_n$, and a plurality of bipolar transistors $TR_1$~$TR_n$. The plural pads 3*a*~3*j* described above are electrically connected to the integrated circuit 12, although the pads 3*a*, 3*b*, 3*d* are not illustrated in FIG. 2. In the integrated circuit 12, the number of the AND circuits $AND_1$~$AND_n$ and the number of the bipolar transistors $TR_1$~$TR_n$ may be 64, respectively, for example. The number of the pads 3*j* may also be 64. Thus, the on-off control of the heating elements for 64 dots is performed by a single drive IC chip A.

When image printing data are serially input from the outside to the pad 3*f*, the data are stored in the shift register 120 of the integrated circuit 12. The data are latched into the latch circuit LT when a latch signal is input from the outside to the pad 3*e*. Subsequently, when a strobe signal is input from the outside to the pad 3*c*, one of the paired input terminals of each AND circuit $AND_1$~$AND_n$ changes to a high level. On the other hand, the other input terminal of the AND circuit $AND_1$~$AND_n$ is either at a high level or a low level depending on the image printing data latched in the latch circuit LT. When the other one input terminal is at a high level, the output terminal of the AND circuit changes to a high level, thereby turning on a corresponding bipolar transistor TR. As a result, a current is supplied to an associated heating element 5 which is wire-bonded to a relevant pad 3*j* connected to the turned-on bipolar transistor.

Figure 3:
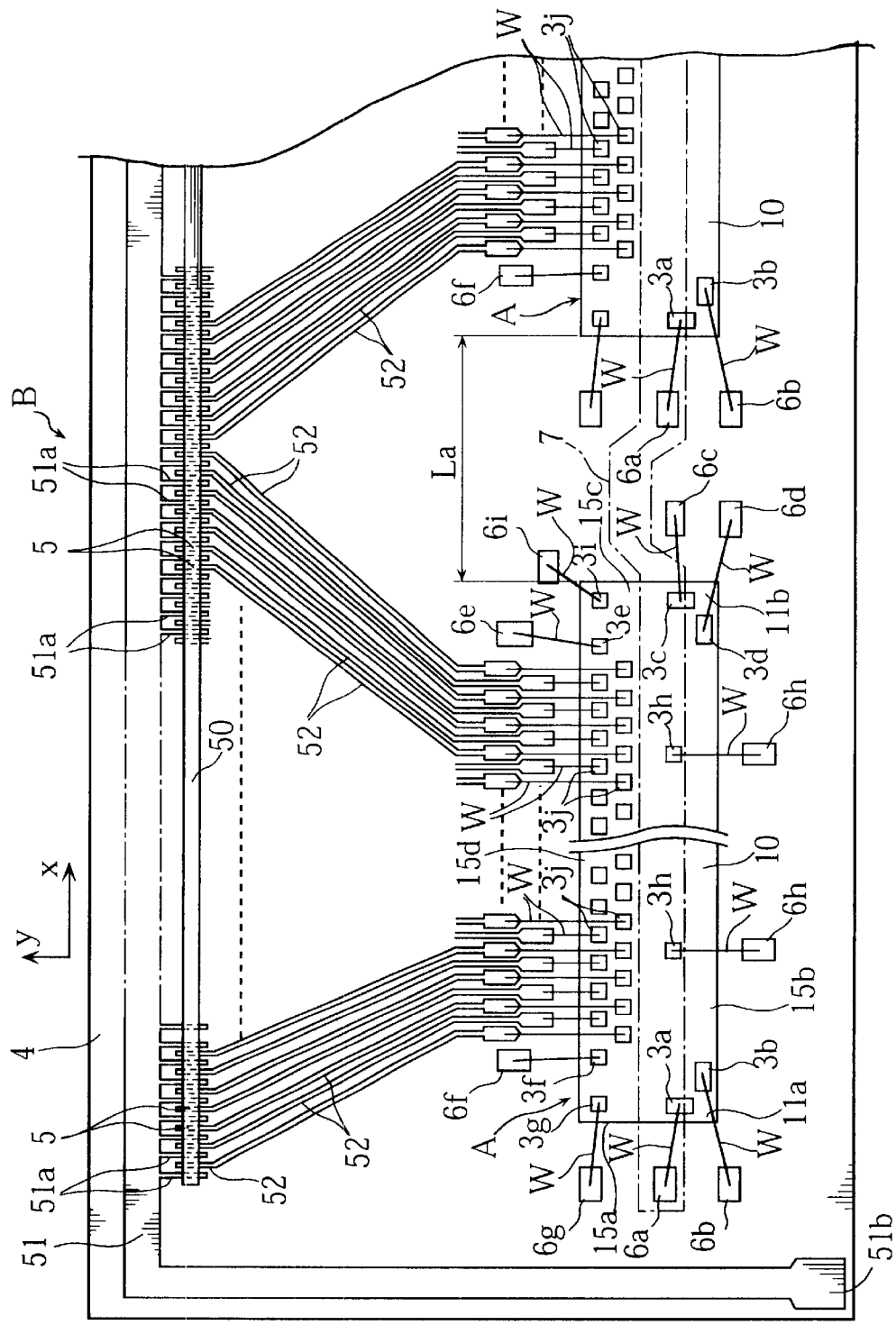
FIG. 3 is a plan view showing a principal portion of an example of thermal printhead embodying the present invention.

FIG. 3 illustrates an example of printhead incorporating drive IC chips A. The printhead B in FIG. 3 comprises an insulating substrate 4 on which a plurality of heating elements 5 are formed in a row extending in the lengthwise direction. The thermal printhead B may be a so-called thick-film thermal printhead. The substrate 4 has a surface formed with a glass glaze layer (not shown) which, in turn, is formed with a common electrode 51 and a plurality of individual electrodes 52. The common electrode has a plurality of comb-teeth projections 51*a*, and each of the individual electrodes has a first end extending between two adjacent comb-teeth projections 51*a*. A linear heating resistor 50 extending in the lengthwise direction is formed to intersect the comb-teeth projections 51*a* and the respective first ends of the individual electrodes 52. The heating resistor 50 may be formed by printing and baking a thick-film of a resistor paste containing, for example, ruthenium oxide as a conductive substance. Each region of the heating resistor 50 defined between two adjacent comb-teeth projections 51*a* serves as a heating element 5 for one dot. The present invention is also applicable to a so-called thin-film thermal printhead. The common electrode 51 extends longitudinally of the substrate 4 (in the lengthwise direction) and along the opposite ends to terminate at terminals 51*b* which receive electric power needed for driving the heating elements 5.

The surface of the substrate 4 carries a plurality of drive IC chips A arranged, at a predetermined interval La, in a row extending in the lengthwise direction. Each of the drive IC chips A has an upwardly directed primary surface 10. Each of the individual electrodes 52 has a second end disposed adjacent to a relevant drive IC chip A for connection to a respective one of the pads 3*j* via a wire W. The other pads 3*a*~3*i* of the drive IC chip A are connected, via wires W, to respective pads 6*a*~6*i* provided adjacent to the drive IC chip A, thereby enabling input/output of signals, power supply, or grounding connection relative to the pads 3*a*~3*j*. Though not shown in FIG. 3, the substrate 4 is provided with a plurality of conductive wiring patterns each having a terminal similar to the terminals 51*b* of the common electrode 51. The pads 6*a*~6*i* are formed suitably on the conductive wiring patterns for establishing electrical connected to devices external to the thermal printhead B. Such an arrangement also applies to the thermal printhead Ba of FIG. 4 to be described later.

The thermal printhead B may have a printing density of 200 dpi for example, and the interval La between each two adjacent drive IC chips is set to be sufficiently large for wire bonding. Accordingly, the pads 6*a*~6*d* for connection to the corresponding pads 3*a*~3*d* of each drive IC chip A are disposed at or near a region between two adjacent drive IC chips A. With such an arrangement, a wiring pattern 7 for power supply for example can be laid under each two adjacent drive IC chips A, as shown by phantom lines in FIG. 3, so that pads 6*a* may be disposed on the wiring pattern 7. Thus, it is possible to supply power to the plurality of drive IC chips A through a single wiring pattern 7. This arrangement allows the wiring pattern to be simplified, as opposed to the case where an individual power supply wiring pattern is provided for each of the drive ICs A to result in a complicated wiring pattern as a whole.

In the thermal printhead B, the wires W for connecting the pads 3*a*~3*d* to the corresponding pads 6*a*~6*d* extend in the lengthwise direction. On the other hand, the pads 3*a*, 3*b* deviate from each other in the widthwise direction, as also do the pads 3*c*, 3*d*. Accordingly, adjacent wires W can be appropriately spaced from each other to avoid shorting between the wires W.

Figure 4:
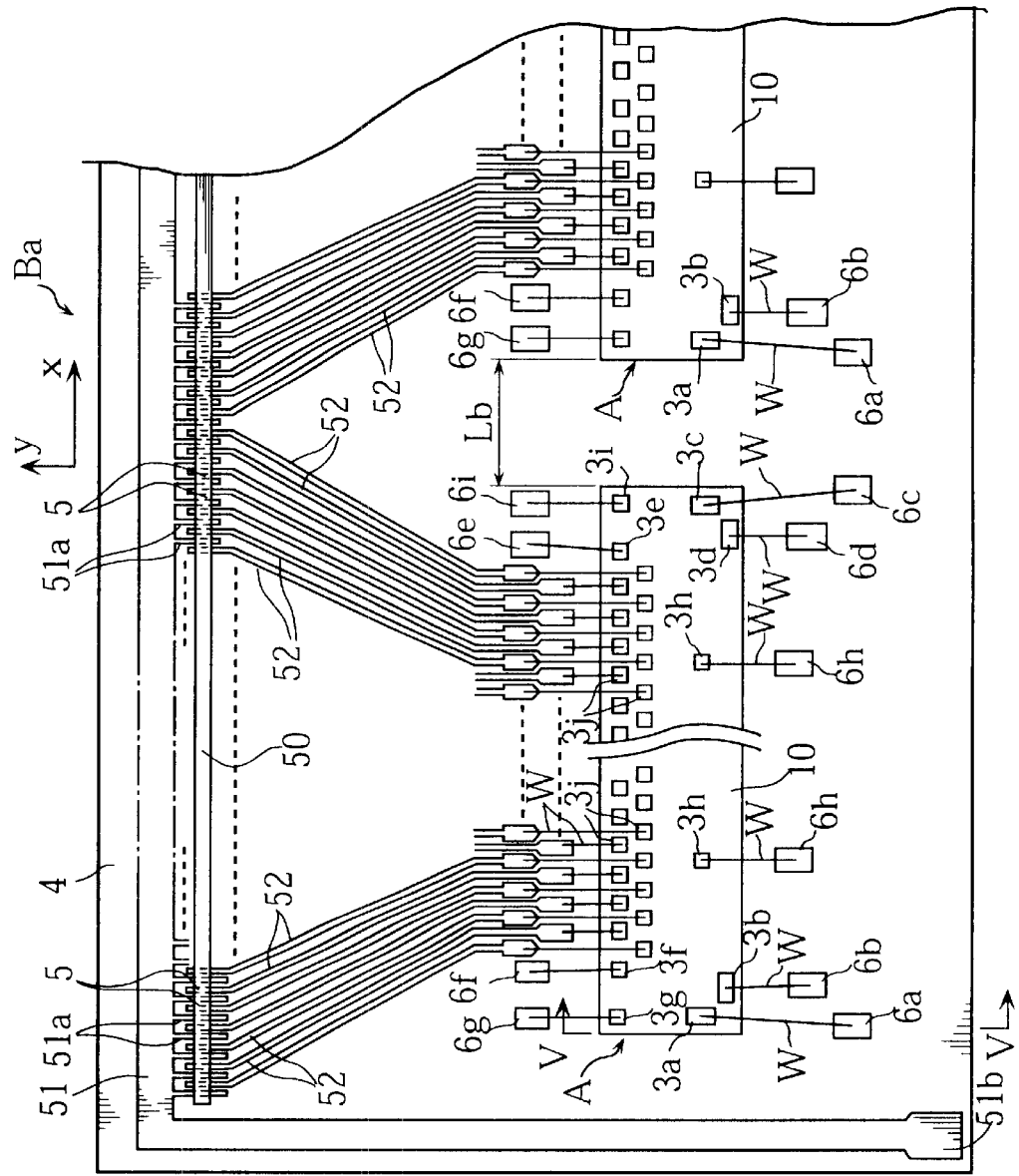
FIG. 4 is a plan view showing a principal portion of another example of thermal printhead embodying the present invention.

FIG. 4 illustrates another example of printhead provided with drive IC chips A. In FIG. 4, the elements which are identical or similar to those of the printhead B shown in FIG. 3 are designated by the same reference signs as those used for the printhead B.

The printhead Ba shown in FIG. 4 has a higher printing density than the printhead B. For this reason, the substrate 4 carries a larger number of drive IC chips than that of the printhead B, and the interval Lb between each two adjacent drive IC chips A is smaller than the interval La in the printhead B. Thus, instead of being arranged between two adjacent drive IC chips A, the pads 6*a*~6*d* are disposed at positions deviating from the corresponding pads 3*a*~3*d* in the widthwise direction.

In the thermal printhead Ba, the wires W for connecting the pads 3*a*~3*d* to the corresponding pads 6*a*~6*d* extend in the widthwise direction. On the other hand, the pads 3*a*, 3*b* deviate from each other in the lengthwise direction, as also do the pads 3*c*, 3*d*. In this case, again, adjacent wires W can be appropriately spaced from each other to avoid shorting between the wires W.

In this way, the drive IC chip A according to the present embodiment can be appropriately used as a component of both kinds of printheads B, Ba.

Figure 5:
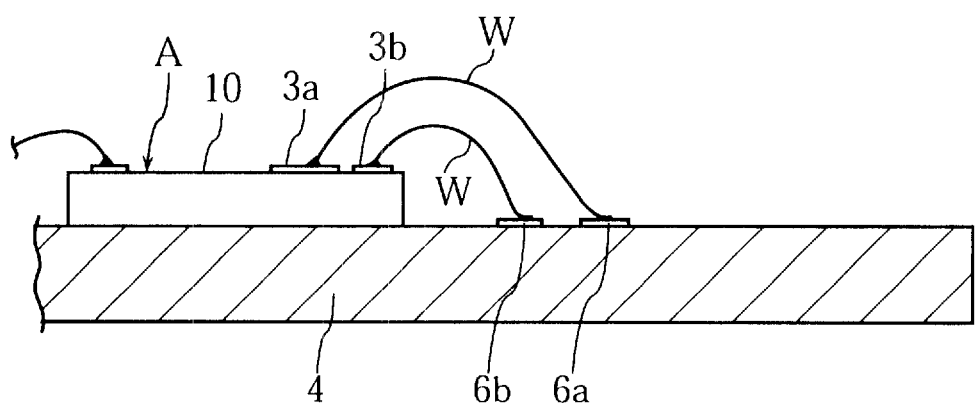
FIG. 5 is a sectional view taken along lines V—V in FIG. 4.

The pads 3*a*, 3*b* may be wire-bonded to the pads 6*a*, 6*b*, respectively, to provide such a structure as shown in FIG. 5.

More specifically, in the illustrated structure, the pad 6b is disposed closer to the drive IC chip A than the pad 6a. Wire-connection is provided between the pads 3b, 6b located closer to each other as well as between the pads 3a, 6a located farther away from each other. According to such a structure, the two wires W are different in radius of curvature, so that the two wires do not interfere with each other in the height direction, thereby more advantageously preventing shorting between the wires. This structure can be easily achieved because the pads 3a, 3b deviate positionally from each other. This is also true with respect other pads 3c and 3d.

Figure 6:
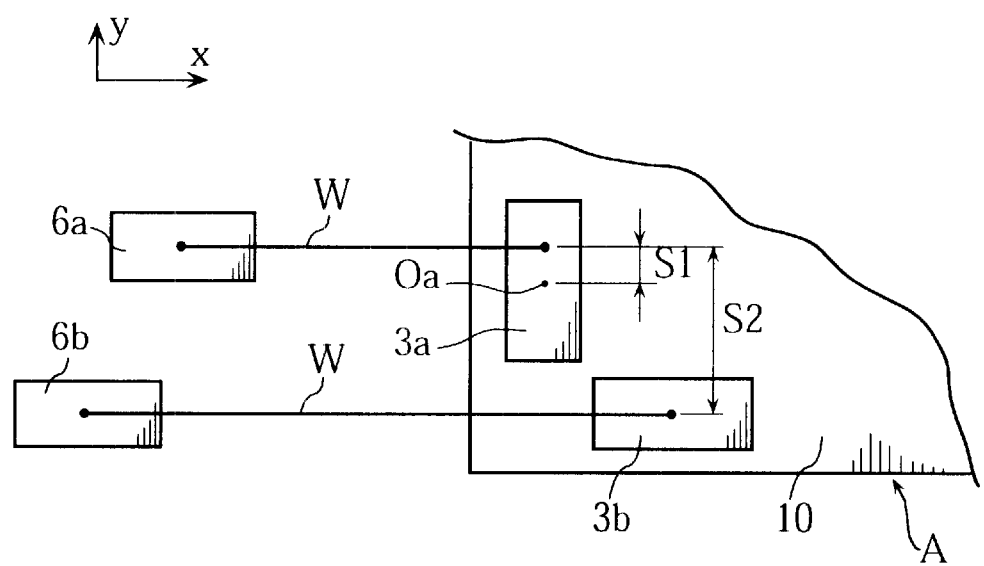
FIG. 6 is a plan view showing a principal portion of a further example of thermal printhead embodying the present invention.

According to the structure shown in FIGS. 3 and 4, one end of each wire W is bonded centrally to a respective one of the pads 3a~3d of the drive IC chip A. However, since the pads 3a~3d are rectangular, it Is possible to bond the wires in a different manner. Specifically, as shown in FIG. 6, in the case where the wires W are extended in the lengthwise direction from the pads 3a, 3b to the pads 6a, 6b, respectively, the wire for the pad 3a may be bonded at a portion offset from the center Oa of the pad 3a by an appropriate amount S1. Thus, it is possible to keep the wire-bonding position farther away from the pad 3b, thereby increasing the distance S2 between the two wires W to more reliably prevent these two wires from contacting each other.

Figure 7:
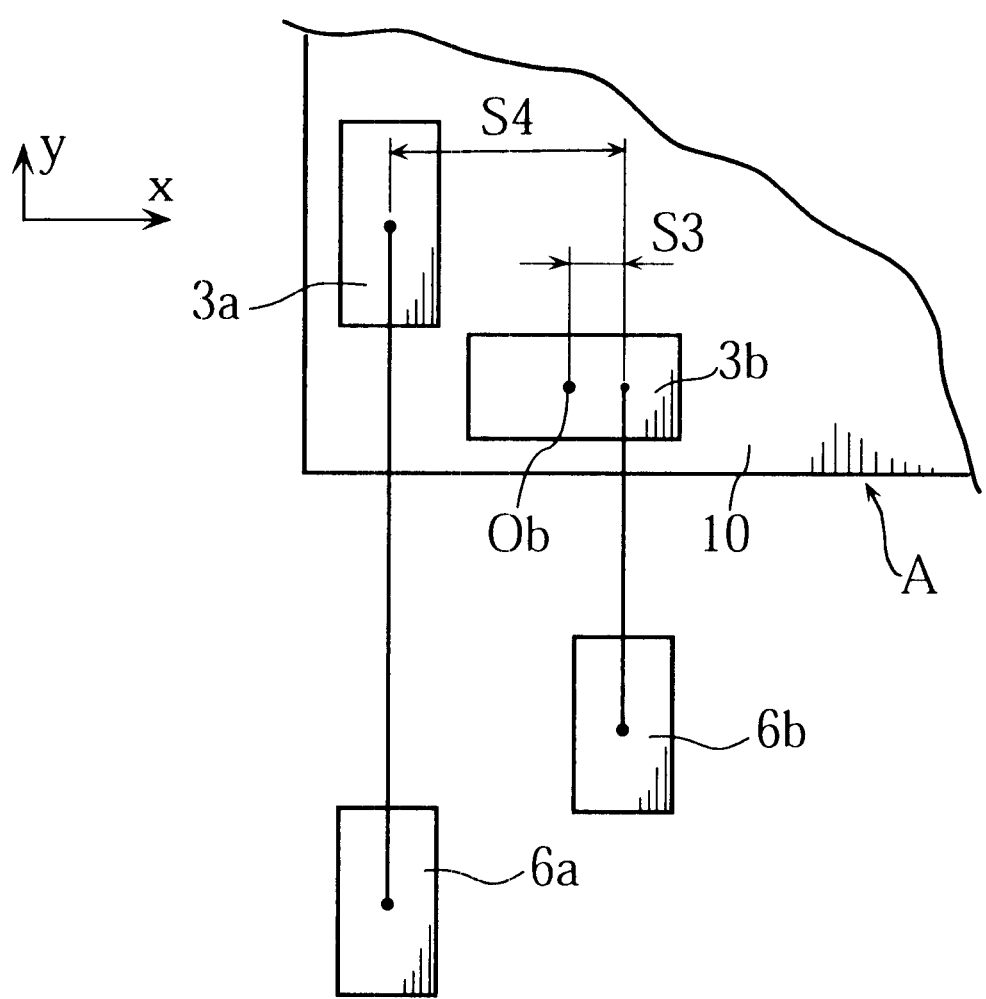
FIG. 7 is a plan view showing a principal portion of still another example of thermal printhead embodying the present invention.
Figure 10:
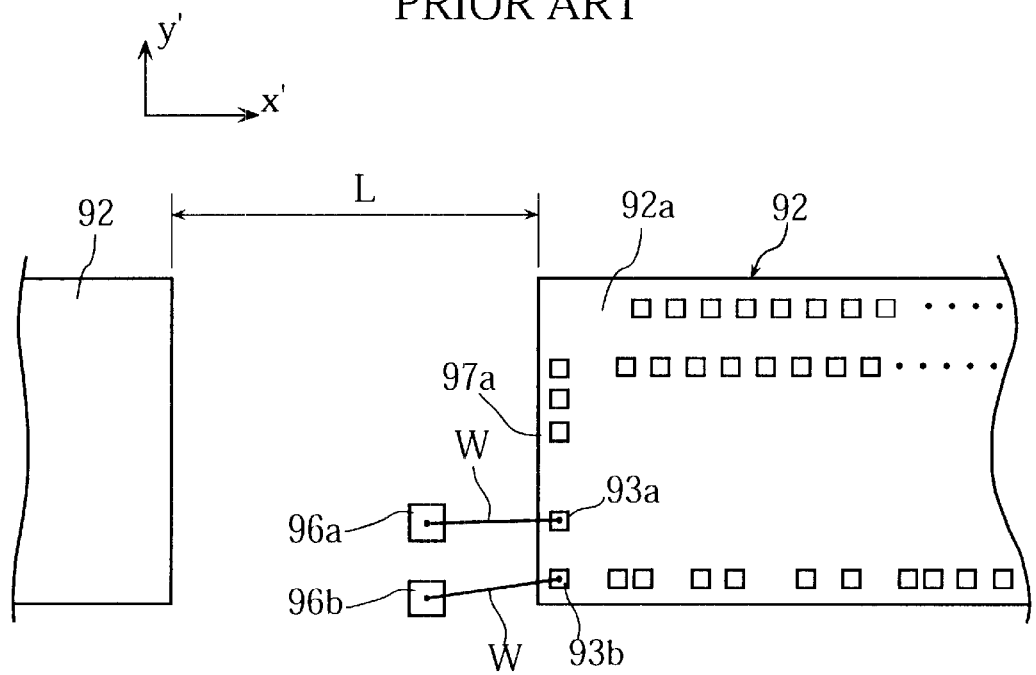
FIG. 10 is a plan view illustrating an example of wire-bonding for the IC chip shown in FIG. 9.
Figure 11:
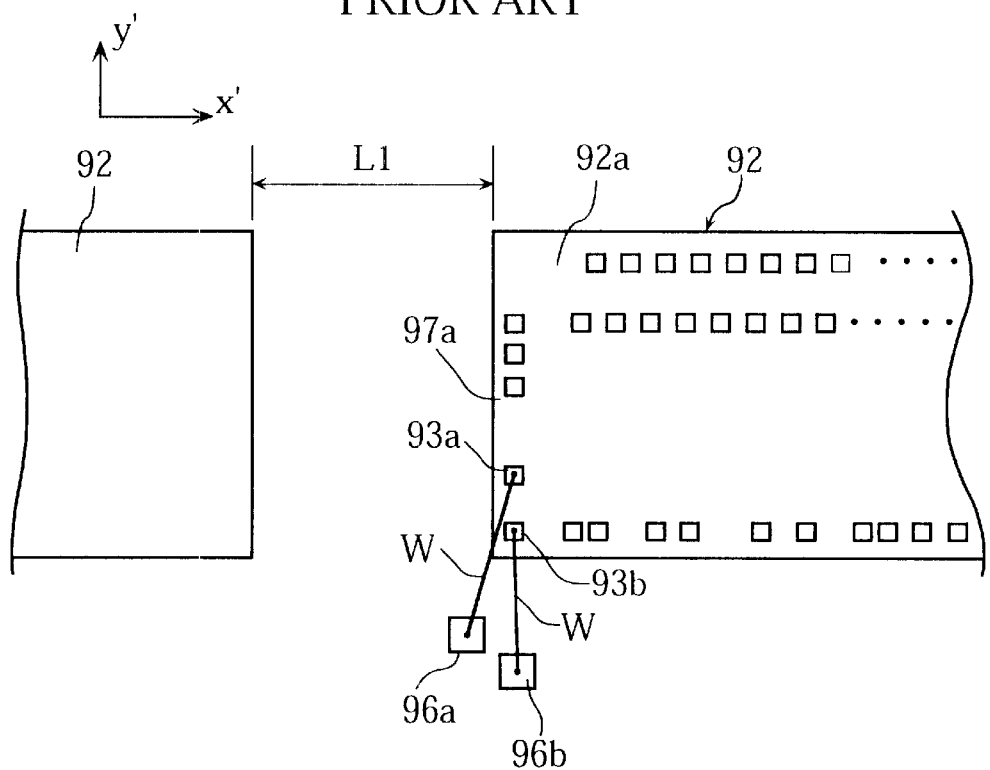
FIG. 11 is a plan view showing another example of wire-bonding for the drive IC chip shown in FIG. 9.

On the other hand, as shown in FIG. 7, in the case where the wires W are extended in the widthwise direction from the pads 3a, 3b to the pads 6a, 6b, respectively, the wire for the pad 3b may be bonded at a position offset from the center Ob of the pad 3b by an appropriate amount S3. Thus, it is possible to keep the wire-bonding position farther away from the pad 3a, thereby increasing the distance S4 between the two wires W to more reliably prevent the two wires from contacting each other. Further, the pads 3a, 3b are held entirely out of overlapping relation with each other both in the widthwise and lengthwise directions. Thus, as long as the wires W are bonded to the pads 3a, 3b at their respective ends which are close to each other, these connected ends of the wires may be held out of contact. Further, the distance between the wires W can be advantageously increased. This is also true with respect to the pads 3c, 3d.

The specific structure of the drive IC chip and the printhead in accordance with the present invention are not limited to the embodiment described above and can be modified in various ways.

In the above-described embodiment, two pairs of pads, i.e., the pads 3a, 3b and the pads 3c, 3d, are provided as examples of the first and the second pads of the claimed invention. However, the present invention is not limited to such an arrangement, but the first and the second pads may be provided only in one pair or in no less than three pairs. In the case where a large number of pads are provided on the primary surface of a drive IC chip, any ones of the pads may be selectable as the first and the second pads of the claimed invention.

The first and the second pads in the present invention may not be rectangular but may be square, for example.

The present invention requires that a first and a second pads be provided at a common corner of the primary surface of a drive IC chip in a specific arrangement. However, the present invention also covers, in its technical scope, the arrangement wherein other pad or pads are additionally provided at the same corner.

What is claimed is:

1. A drive IC chip for a printhead comprising:
   a built-in integrated circuit for selectively driving a plurality of printing elements of the printhead;
   a primary surface including a first edge extending in a first direction, a second edge extending in a second direction transverse to the first direction, and a third edge opposite to the second edge;
   a first and a second pads provided on the primary surface in electrical connection to the integrated circuit, the first pad being rectangular to be elongated in the first direction, the second pad being rectangular to be elongated in the second direction; and
   a plurality of third pads for electrically connecting the integrated circuit to the plurality of printing elements, the third pads being arranged along the third edge;
   wherein the first and the second pads are provided at a corner at which the first and the second edges meet, the corner being spaced from the third edge; and
   wherein respective centers of the first and the second pads deviate positionally from each other in the first and the second directions.

2. The drive IC chip according to claim 1, wherein each of the first and the second pads is used for any one of supplying power for driving the integrated circuit, grounding the integrated circuit, and inputting/outputting signals to the integrated circuit.

3. The drive IC chip according to claim 1, wherein the first and the second pads are entirely out of overlapping relation with each other both in the first and the second directions.

4. The drive IC chip according to claim 1, wherein the first pad is provided at the first edge, and the second pad is provided at the second edge.

5. The drive IC chip according to claim 1, wherein the primary surface is rectangular to have four corners.

6. A printhead comprising a substrate provided with a plurality of printing elements arranged in a row, and a plurality of drive IC chips;
   each of the drive IC chips comprising:
   a built-in integrated circuit for selectively driving the plurality of printing elements;
   a primary surface including a first edge extending in a first direction, a second edge extending in a second direction transverse to the first direction, and a third edge opposite to the second edge;
   a first and a second pads provided on the primary surface in electrical connection to the integrated circuit, the first pad being rectangular to be elongated in the first direction, the second pad being rectangular to be elongated in the second direction; and
   a plurality of third pads for electrically connecting the integrated circuit to the plurality of printing elements, the third pads being arranged along the third edge;
   wherein the first and the second pads are provided at a corner at which the first and the second edges meet, the corner being spaced from the third edge; and
   wherein respective centers of the first and the second pads deviate positionally from each other in the first and the second directions.

7. The printhead according to claim 6, wherein the printing elements are heating elements.

* * * * *